(12) United States Patent
Ukaji

(10) Patent No.: US 6,285,457 B2
(45) Date of Patent: *Sep. 4, 2001

(54) EXPOSURE APPARATUS AND DEVICE MANUFACTURING METHOD INCLUDING MEASURING POSITION AND/OR DISPLACEMENT OF EACH OF A BASE AND A STAGE WITH RESPECT TO A SUPPORT

(75) Inventor: Takao Ukaji, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/359,910

(22) Filed: Jul. 26, 1999

(30) Foreign Application Priority Data

Jul. 27, 1998 (JP) ................................................ 10-210981

(51) Int. Cl.⁷ ..................................................... G01B 11/02
(52) U.S. Cl. ........................................... 356/500; 356/508
(58) Field of Search ..................................... 356/358, 356, 356/363; 414/936

(56) References Cited

U.S. PATENT DOCUMENTS

| | | | |
|---|---|---|---|
| 4,659,225 | * 4/1987 | Takahashi | 356/358 |
| 5,194,893 | 3/1993 | Nishi | 355/53 |
| 5,281,996 | 1/1994 | Bruning et al. | 355/77 |
| 5,363,196 | 11/1994 | Cameron | 356/358 |
| 5,658,700 | * 8/1997 | Sakai | 430/30 |
| 6,020,964 | * 2/2000 | Loopstra et al. | 356/358 |

FOREIGN PATENT DOCUMENTS 5-315221   11/1993   (JP) .

* cited by examiner

Primary Examiner—Frank G. Font
Assistant Examiner—Phil Natividad
(74) Attorney, Agent, or Firm—Fitzpatrick, Cella, Harper & Scinto

(57) ABSTRACT

An exposure apparatus includes a projection optical system, a barrel supporting member for supporting the projection optical system, a stage being movable relative to the projection optical system, a base for supporting the stage, a base measuring system for measuring at least one of a position and a displacement of the base with respect to the barrel supporting member, and a stage measuring system for measuring at least one of a position and a displacement of the stage with respect to the barrel supporting member.

33 Claims, 10 Drawing Sheets

EXPOSURE APPARATUS AND DEVICE MANUFACTURING METHOD INCLUDING MEASURING POSITION AND/OR DISPLACEMENT OF EACH OF A BASE AND A STAGE WITH RESPECT TO A SUPPORT

FIELD OF THE INVENTION AND RELATED ART

This invention relates generally to an exposure apparatus for use in the manufacture of semiconductor devices or liquid crystal panels, for example. In another aspect, the invention is concerned with a device manufacturing method using such an exposure apparatus.

FIG. 9 shows an example of measuring means in a positioning system usable in a semiconductor exposure apparatus, for example, and specifically, it illustrates the arrangement of a measuring system based on laser interferometers.

Denoted in the drawing at 120 is a wafer chuck for carrying thereon a wafer, not shown. Denoted at 121 is a top stage for supporting the wafer chuck 120. The top stage can be moved by a guide and an actuator (not shown) in a Y axis direction and through a long stroke, and also it can be moved in a Z axis direction and rotational directions of wX, wY and θ through a short stroke.

Denoted at 130 is a control box including a calculating circuit and a driving circuit, for example. Denoted at 131a is the reflection surface of an X mirror mounted on the top stage 121, and denoted at 131b is the reflection surface of a Y mirror mounted an the top stage 121. Denoted at 133a, 133b and 133c are interferometers, respectively, for measuring positions of the top stage 121 in the X direction, at corresponding places thereof, and denoted at 134a and 134b are interferometers, respectively, for measuring positions of the top stage 121 in the Y direction, at corresponding places thereof. These interferometers 133a–133c and 134a and 134b are fixedly supported by a base, not shown, which provides a reference for the measurement.

Conventionally, for the positioning with the use of a positioning system, laser light is projected to predetermined locations on a reflection mirror, and position detection is performed on the basis of reflected light therefrom and of information related to a change in position of incidence of the beam along the bean incidence direction. The positioning control is then made in accordance with the result of the detection. As regards detection with respect to rotational direction, it is made on the basis of information about a change in position of beam incidence at two locations along one and the same axial direction. Namely, in the measuring system of FIG. 9, on the basis of positional change information based on the interferometers 133a, 113b and 133c, position detection with respect to the Y-axis direction and wX direction is performed. Then, positioning control in regard to five-axis directions except the Z axis is performed in accordance with the position detection information based on the laser interferometers. The position detecting means in regard to the Z-axis direction may usually comprise a linear encoder or an electrostatic capacity sensor, for example, accommodated in a movement stage, and the positioning control with respect to the Z-axis direction is performed in accordance with the result of detection by it.

FIG. 10 shows a general structure of a semiconductor exposure apparatus having such a measuring system as described above.

Denoted in FIG. 10 at 101 is an illumination system for illuminating a reticle pattern, and denoted at 102 is a reticle having a pattern to be transferred. Denoted at 103 is a projection lens for projecting the reticle pattern onto a wafer, and denoted at 104 is a barrel supporting member for supporting the projection lens 103. Denoted at 107a is a light emitting portion of focus detecting means for measuring the distance between the wafer and the focal point of the projection lens 103, and denoted at 107b is a light receiving portion of this focus detecting means. Denoted at 115 is an interferometer for controlling the position of a stage system, wherein denoted at 121 is a top stage, denoted at 110 is an X stage and denoted at 111 is a Y stage. Denoted at 117 is a guide with an X linear motor, for driving the X stage, and denoted at 118 is a guide with a Y linear motor, for driving the Y stage. Denoted at 125 is a Z actuator for moving the top stage 121 in the Z direction relative to the X stage 110. Denoted at 122 are Z displacement sensors provided in the stage system described above. By using these Z displacement sensors 122, any displacement of the top stage 121 with respect to the X stage 110 is measured at three locations, by which any displacement of the top stage in the Z direction as well as displacement thereof in a tilt direction can be measured.

The positioning system having such Z-axis position detecting means, however, involves the following problems.

(1) The positional information about the top stage in the Z direction is produced on the basis of the positional relation between the X stage and the top stage. Therefore, any deformation of the stage guide resulting from a movement load such as inertia produced during stage acceleration or deceleration or the weight of the stage itself, or any deformation of a base or a structure supporting the stage will cause a measurement error. This is a bar to high precision positioning.

(2) Any change in guiding precision or deformation of the base, for example, has to be compensated for by the Z actuator provided between the X stage and the top stage. This requires that the Z actuator between the X stage and the top stage has a large stroke.

(3) The measurement of displacement in the Z direction is based on a principle different from that of the measurement in the X and Y directions using interferometers. A difference in frequency characteristic will produce a measurement error.

SUMMARY OF THE INVENTION

It is an object of the present invention to provide an exposure apparatus, by which measurement of a position or displacement of a stage can be performed while taking a barrel supporting member as a reference, and by which high precision alignment is assured.

It is another object of the present invention to provide an exposure apparatus, by which Z-axis measurement can be done with a simple structure, and by which high precision alignment is assured.

In accordance with an aspect of the present invention, there is provided an exposure apparatus, comprising: a projection optical system; a barrel supporting member for supporting said projection optical system; a stage being movable relative to said projection optical system; a base for supporting said stage; base measuring means for measuring at least one of a position and a displacement of said base with respect to said barrel supporting member; and stage measuring means for measuring at least one of a position and a displacement of said stage with respect to said barrel supporting member.

In preferred forms of this aspect of the present invention, said stage measuring means may include a laser interferometer. Said interferometer may project measurement light to a reflection surface associated therewith, along a direction orthogonal to an optical axis of said projection optical system. Said stage may be provided with a reflection surface for obliquely reflecting measurement light projected from said interferometer. Said stage may be provided with a first reflection surface extending substantially perpendicularly to measurement light projected from said interferometer, and a second reflection surface for obliquely reflecting measurement light projected from said interferometer.

The measurement light being obliquely reflected may bear a component in the optical axis direction of said projection optical system. A plane containing the measurement light projected from said interferometer and the measurement light as obliquely reflected, may be substantially parallel to an optical axis of said projection optical system. There may he an acute angle defined between the measurement light as projected and the measurement light as obliquely reflected.

The exposure apparatus may further comprise stationary reflection means having a reflection surface for reflecting the obliquely reflected measurement light. Said stationary reflection means may be provided on said barrel supporting member. A normal to said stationary reflection means may extend substantially parallel to a direction of the measurement light projected on said stationary reflection means.

Said stage may have plural reflection surfaces, each being said reflection surface, for reflecting measurement light obliquely. Said stage measuring means may selectively use said reflection surfaces of said stage. Said stage measuring means may selectively use said reflection surfaces of said stage in accordance with positional information related to said stage. Said stage measuring means may be operable to project measurement light to at least one of said reflection surfaces, at least at three locations.

Said stage measuring means may be operable to measure at least one of a position and a displacement of said stage with respect to an optical axis direction of said projection optical system, and a rotational component of said stage in a direction inclined with respect to the optical axis of said projection optical system, by use of plural measurement lights as obliquely reflected.

Said stage measuring means may be operable to measure at least one of a position and a displacement of said stage with respect to an optical axis direction of said projection optical system, by use of the measurement light as obliquely reflected.

Said stage measuring means may perform position or displacement measurement with respect to six-axis directions of said stage.

The exposure apparatus may further comprise control means for controlling said stage on the basis of the measurement by said stage measuring means.

Said base may be isolated from said barrel supporting member with respect to vibration.

The exposure apparatus may further comprise mount means through which said barrel supporting member is supported on a floor. Said mount means may comprise an active mount.

The exposure apparatus may further comprise mount means through which said base is supported on a floor. Said mount means may comprise an active mount.

The exposure apparatus may further comprise first mount means for supporting said barrel supporting member and second mount means, separate from said first mount means, for supporting said base.

Said base supporting mount means may be controlled in accordance with the detection by said base measuring means. Said base supporting mount means may be controlled in accordance with a stage driving signal.

The exposure apparatus may be used with a reticle and a wafer, for performing an exposure process in which the reticle and the wafer may be scanningly moved relative to said projection optical system while exposure light may be projected to the reticle during the scan, such that a pattern of the reticle can he transferred to the wafer.

In accordance with another aspect of the present invention, there is provided a device manufacturing method, comprising the steps of: registering a barrel support for supporting a projection optical system, with respect to a predetermined position; measuring at least one of a position and a displacement of a base with respect to the barrel supporting member; measuring at least one of a position and a displacement of a stage with respect to the barrel supporting member; and transferring a reticle pattern to a wafer placed on the stage.

The method may further comprise registering the base for supporting the stage, being movable relative to the projection optical system, with respect to a predetermined position.

The method may further comprise applying a photosensitive material to the wafer, and developing an exposed portion of the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
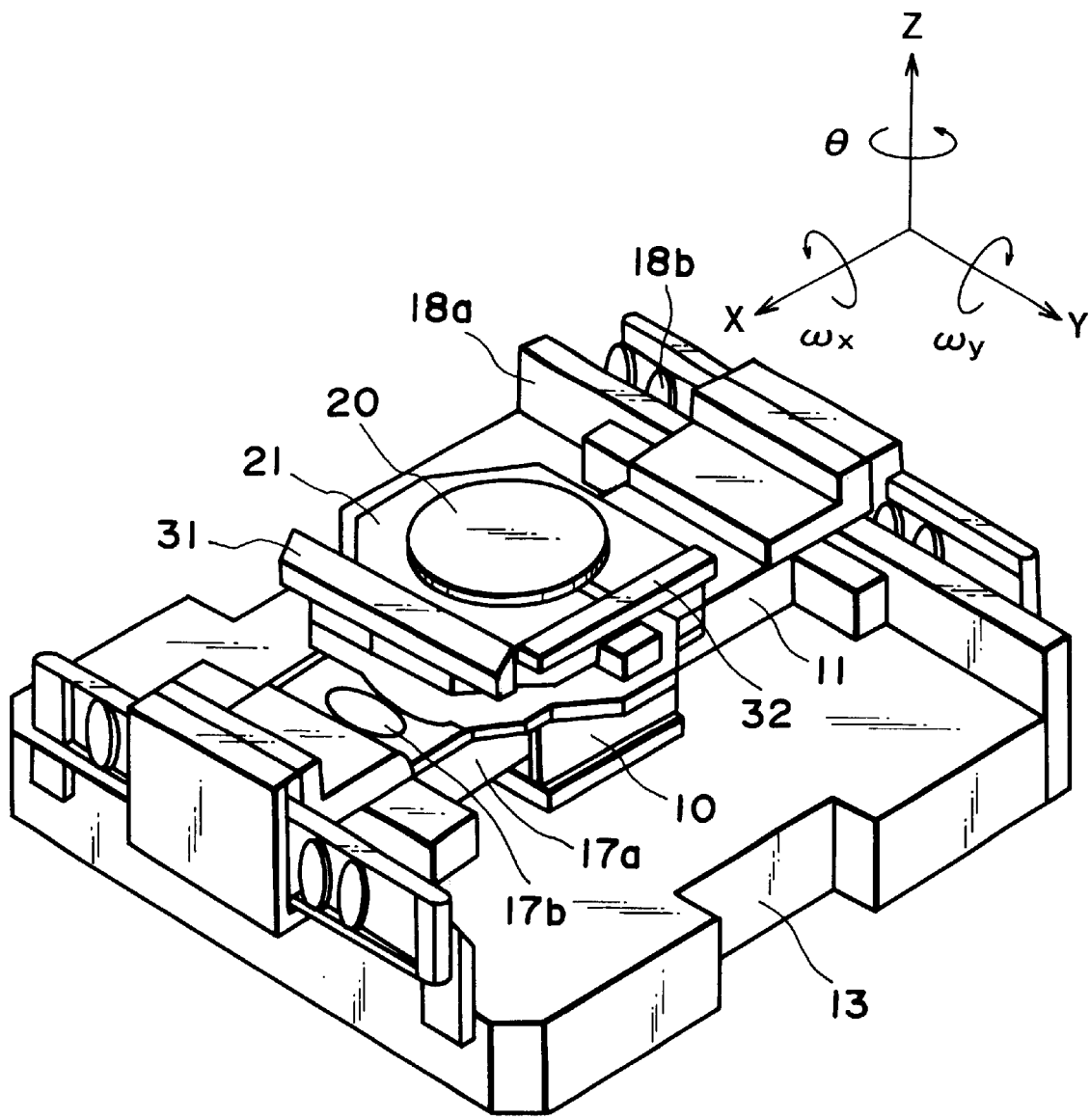
FIG. 1 is a schematic view of a wafer stage according to an embodiment of the present invention.

FIG. 1 is a schematic and perspective view of a six-axis wafer stage system according to a first embodiment of the present invention.

Denoted in FIG. 1 at 13 is a stage base having a reference plane, an X-Y plane, at its top surface. Denoted at 11 is a Y stage which is guided by a Y guide 18a in a Y direction, and is movable in the Y direction by means of a Y linear motor 18b. Denoted at 10 is an X stage which is guided in an X direction by an X guide 17a, provided on the Y stage 11. The X stage is movable in the X direction relative to the Y stage 11, by means of an X linear motor 17b provided an the Y stage 11. Both of the X stage 10 and the Y stage 11 are supported on the reference plane of the stage base 13, through static bearing means (not shown).

Mounted on the X stage 10 being movable in the X and Y directions is a top stage 21 which is operable in four axes (Z, wX, wY and θ) relative to the X stage 10. Denoted at 20 is a wafer chuck for carrying thereon a wafer, not shown.

Figure 2:
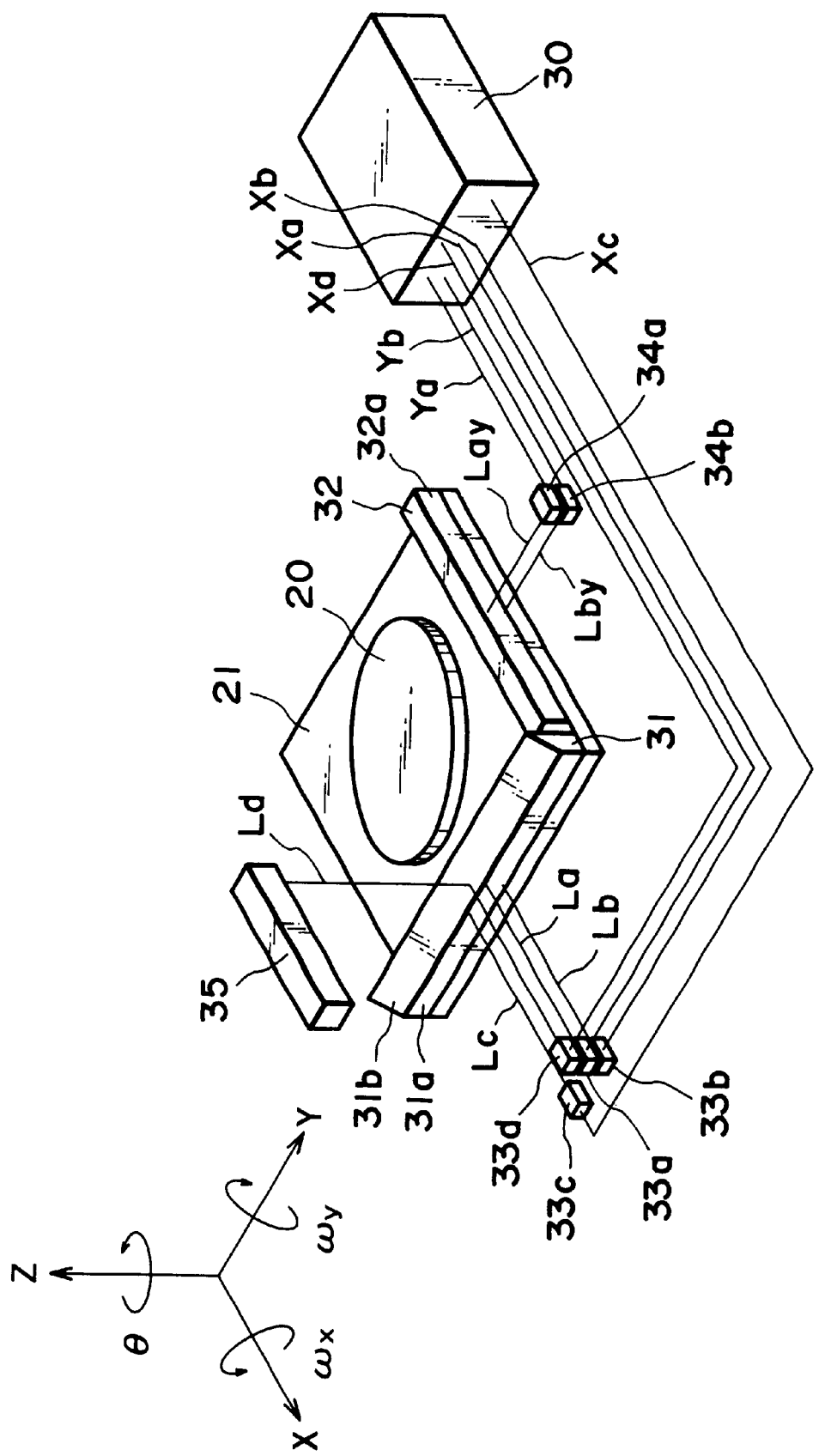
FIG. 2 is a schematic view for explaining a stage measuring system according to the present invention.

FIG. 2 is a perspective view for illustrating the structure of a measuring system (stage measuring means) for measuring the position and/or displacement of the stage on the basis of laser interferometers and a Z-measurement laser interferometer.

Denoted in the drawing at 20 is a wafer chuck for carrying thereon a wafer, not shown. Denoted at 21 is a top stage for supporting and carrying the wafer chuck 20. The top stage 21 can be moved in the X and Y directions by means of guides and actuators (not shown) through a long stroke, and also it can be moved in the Z direction and in rotational directions wX, wY and θ through a short stroke.

Denoted at 30 is a control box including calculation circuit means and driving circuit means, for example. Denoted at La, Lb, Lc, Ld, Lay and Lby are laser lights for position measurement. Denoted at 31 is an X mirror mounted on the top stage 5, and it comprises an integral mirror structure having reflection surfaces 31a and 31b. The reflection surface 31a is an optical component being disposed so that the surface extends perpendicularly to the X direction. The reflection surface 31b is provided by an inclined reflection surface and it is an optical component being disposed obliquely with an angle of 45 deg. or more in the wY direction with respect to the X-Y plane. Denoted at 32 is a Y mirror mounted on the top stage 5, and it has a reflection surface 32a being formed perpendicularly to the Y-axis direction.

Denoted at 33a, 33b and 33c are interferometers for performing measurement of the top stage 21 with respect to the X direction. They serve to project laser beams parallel to the X direction, to predetermined positions on the reflection surface 31a, respectively. On the basis of reflection light from these positions, information about any positional change with respect to the beam incidence direction (X direction) is produced.

Denoted at 34a and 34b are interferometers for performing measurement of the top stage 21 with respect to the Y direction. They serve to project laser beams parallel to the Y direction, to predetermined positions on the reflection surface 32a, respectively. On the basis of reflection light from these positions, information about any positional change with respect to the beam incidence direction (Y direction) is produced.

Denoted at 33d is an interferometer which is disposed in alignment with the interferometer 33a. It serves to project a laser beam to the reflection surface 31b along the X direction.

Denoted at 33a, 33b and 33d are those interferometers disposed along the Z direction to detect mutually parallel laser beams La, Lb and Ld. Denoted at 34a and 34b are those interferometers which are disposed in the Z direction to detect mutually parallel laser beams Lay and Lby.

These interferometers 33a, 33b, 33c, 33d, 34a and 34b are fixedly held by a supporting member (not shown) which defines a measurement reference.

Denoted at 35 is a stationary mirror. It functions to reflect the laser beam, having been reflected by the reflection surface 31b to bear a Z-direction component, so that it goes back along its oncoming beam path. The mirror 35 has a length corresponding to the movement amount of the top stage 21 in the X direction, and it is fixedly mounted on a supporting member (not shown) which provides a measurement reference.

The laser interferometers described above each functions to detect positional change information (displacement amount or speed, for example) related to a reflection surface associated with it. They may have a well-known structure and, therefore, a description of the details thereof will be omitted here.

The positions of the mirrors 31 and 32, that is, the initial position of the top stage 21, has been memorized in the control box 30. The current position of the top stage 21 can be, therefore, determined by adding, to this memorized position, an integrated value of displacements of the mirrors 31 and 32 measured by the corresponding laser interferometers. The position measurement to the stage in the X and Y directions can be performed by using the laser interferometers 33a and 34a. Also, a rotational amount measurement to the stage in the θ direction can be done by detecting a difference between the detected values of the laser interferometers 33a and 33c and by processing it within the control box 30. Further, a rotational amount measurement to the stage with respect to the wY direction can be made by detecting a difference between the detected values of the laser interferometers 33a and 33b and by processing it within the control box 30. A rotational amount measurement to the stage with respect to the wX direction can be made by detecting a difference between the detected values of the laser interferometers 34a and 34b and by processing it within the control box 30.

A position measurement to the stage with respect to the Z direction can be made by detecting a difference between the detected values of the laser interferometers 33a and 33b and by processing it within the control box 30. Details of this will be described below.

Figure 3:
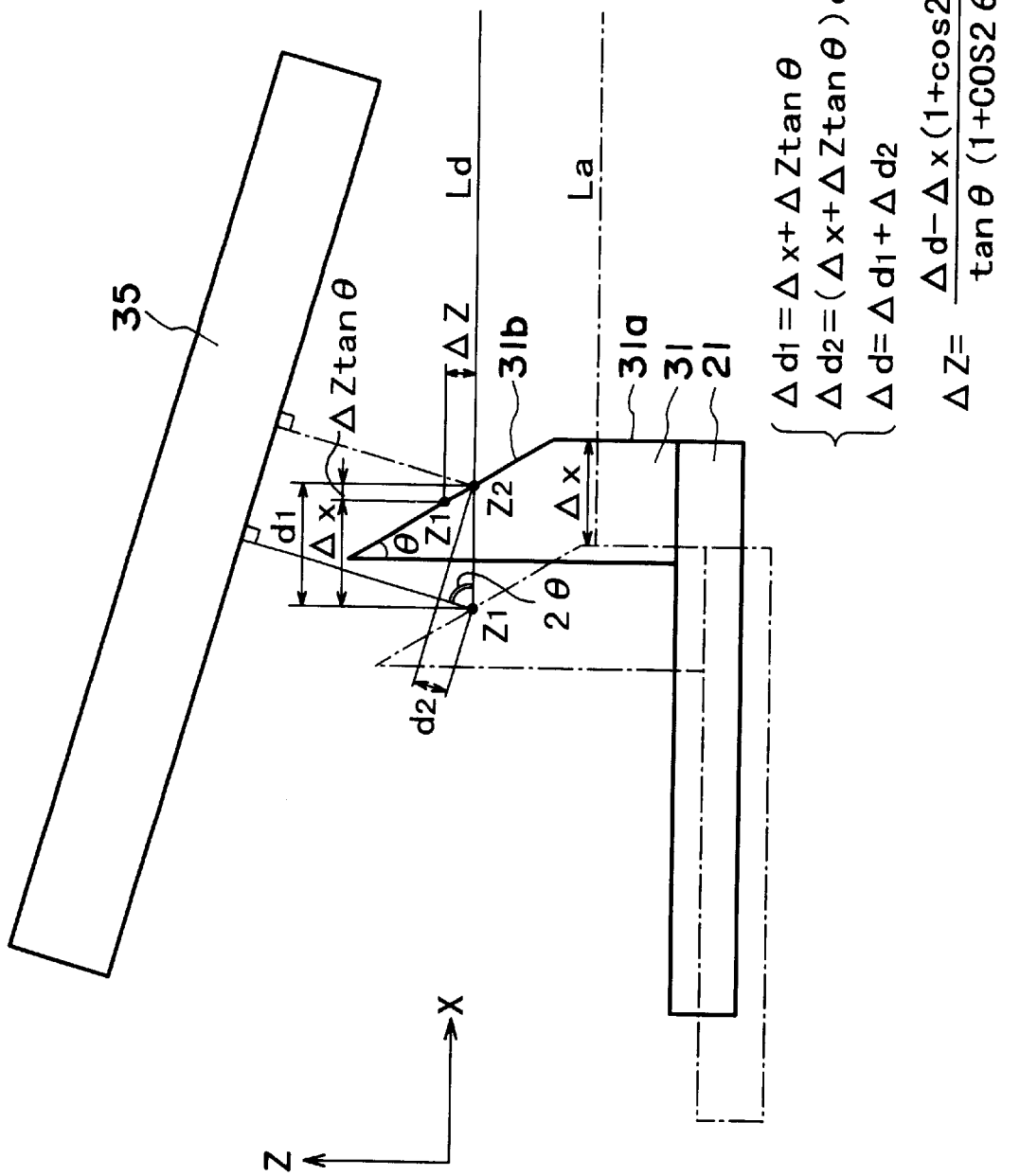
FIG. 3 is a schematic view for explaining the principle of stage position measurement, in the present invention.

FIG. 3 is a schematic view for explaining details of position measurement in the Z direction.

Laser beam Ld projected from the laser interferometer 33d is deflected by the reflection surface 31b at a predetermined angle so that it bears a component in the positive Z direction. The laser beam is then incident on the reflection surface 35a of the stationary mirror 35, by which it is reflected backwardly. Here, a change in a detected value of the laser interferometer 33d as the laser beam Ld shifts from its initial incidence point $Z_1$ on the mirror reflection surface 31b to the current incidence point $Z_2$ is denoted by $\Delta d$, while a change in a detected value of the laser interferometer 33a is denoted by $\Delta x$.

In this case, as shown in the drawing, a change $\Delta d_1$ of the laser beam Ld in the X-axis direction and a change $\Delta d_2$ thereof with respect to the direction of reflection can be determined by the following equation:

$$\Delta d_1 = \Delta x + \Delta z \tan \theta$$

$$\Delta d_2 = (\Delta x + \Delta z \tan \theta) \cos 2\theta$$

Thus, a change $\Delta z$ in the detected value with respect to the Z direction can be determined on the basis of the change $\Delta d$ in the detected value of the laser interferometer 33d, using the following equation:

$$\Delta z = [\Delta d - \Delta x(1+\cos 2\theta)]/[\tan \theta (1+\cos 2\theta)].$$

The mirror is so inclined that the reflected light defines an acute angle with respect to incidence light defines an acute angle with respect to incidence light (i.e., so that the angle 2θ in FIG. 3 satisfies a relation 0 (deg.)<2θ<90 (deg.)). This allows that the stationary mirror 35 is mounted so as not to cause mechanical interference with other structural components. Therefore, the shape of the top stage in the X direction can be made smaller.

Since, in this embodiment, the top stage can be made smaller, any unstable positioning error factor such as thermal deformation of the top stage, for example, can be reduced significantly. Further, a reduction in weight of the top stage is effective to increase the natural frequency of the stage, such that the positioning control performance is improved. This assures high precision and high speed alignment of the reticle 2 and a wafer (not shown) placed on the wafer chuck 4.

In this embodiment, an optical element is used to deflect a measurement beam so that it bears a component in the Z-axis direction. Once the light deflected by the optical element bears a component in the Z-axis direction, the position of the stage in the Z direction can be detected. While, in the example described above, a mirror having a reflection surface inclined with respect to a reference plane is used, the optical element is not limited to it. For example, a reflection type or transmission type diffraction grating may be used to deflect inputted light. Such a diffraction grating may have a large number of slits formed parallel to the reference plane. The grating surface may be disposed perpendicularly or obliquely with respect to the reference plane. When measurement light is projected onto the grating surface in a direction substantially parallel to the reference plane, higher order diffractive light is produced in the Z direction. By using such higher order diffractive light (e.g., negative first order light), the position of the stage in the Z direction can be measured. In a case where a diffraction grating having its grating surface placed perpendicularly to the incident measurement beam is used, there occurs no change in the length of the light path of the measurement light in response to displacement of the stage in the Z direction only. However, if the grating shifts in the Z direction, the phase of the first order diffraction light changes. Thus, by measuring such a phase change using an interferometer, the shift of the stage in the Z-axis direction can be measured.

In this embodiment, the stage is provided with only one mirror having an inclined reflection surface. However, plural mirrors with inclined reflection surfaces may be formed on the stage.

Figure 4:
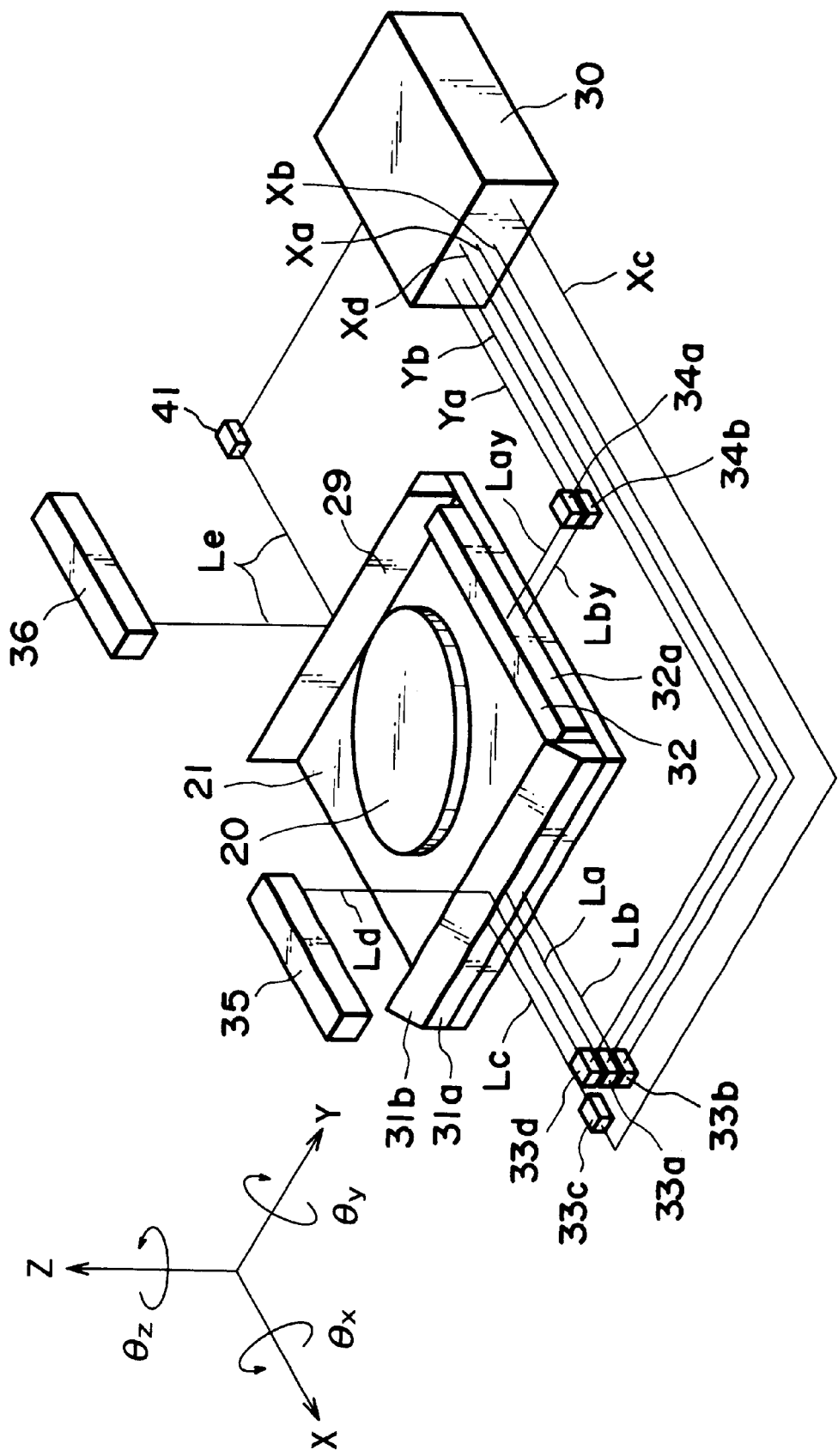
FIG. 4 is a schematic view of a first modified example of a wafer stage according to the present invention.

FIG. 4 shows an example wherein a stage is provided with plural mirrors with inclined reflection surfaces.

As compared with the stage system of the preceding embodiment, the stage system illustrated in FIG. 4 is provided with additional elements: that is, a mirror 29 having an inclined reflection surface, a laser interferometer 41 for projecting measurement light to the inclined reflection surface of the mirror 29, and a stationary mirror 36. The interferometer 41 projects the measurement light to the inclined mirror reflection surface in an opposite direction, along the X direction, as compared with the interferometer 33d. However, the interferometer 41 and the mirrors 29 and 36 have essentially the same functions as those of the interferometer 33d and the mirrors 31 (31b) and 35. Since both of the measurement beams from the interferometers 41 and 33d are reflected while being deflected in the Z direction, depending on the position of the stage 2, there is a possibility of mechanical interference between the measurement light and other structural components. In consideration of it, in the stage system illustrated, the interferometers 33d and 41 are interchanged in accordance with the state of operation of the stage system.

Figure 5:
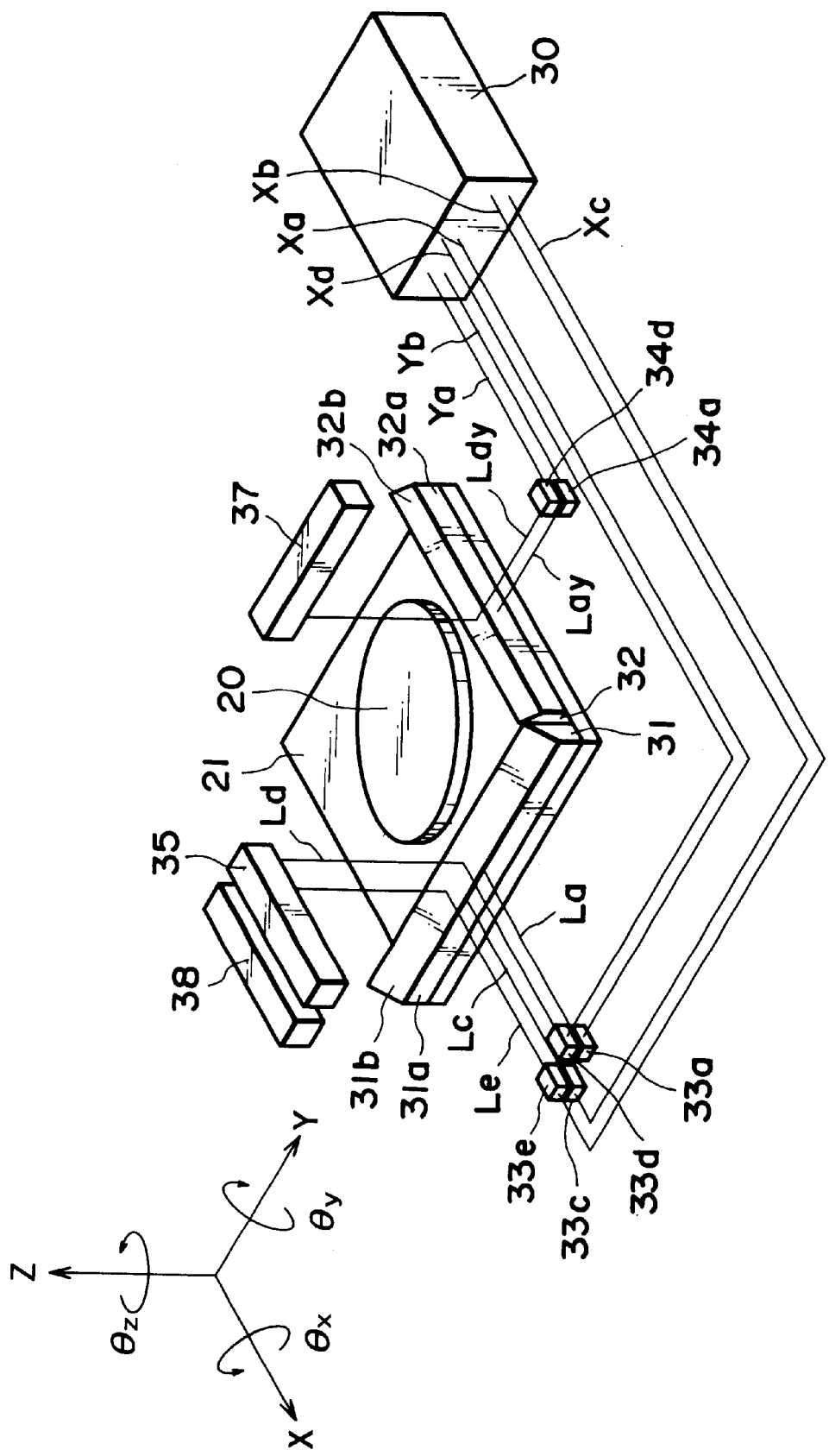
FIG. 5 is a schematic view of a second modified example of a wafer stage according to the present invention.

FIG. 5 shows another example wherein a stage is provided with plural mirrors with inclined reflection surfaces.

As compared with the stage system of FIG. 2, in the stage system illustrated in FIG. 5, the Y mirror has an inclined reflection surface formed thereon. Further, the stage system is provided with additional elements: that is, an interferometer 33e for projecting measurement light to the inclined reflection surface provided on the X mirror, a stationary mirror 38 for reflecting measurement light of the interferometer 33e, having been reflected by the inclined surface 31b, backwardly toward it, an interferometer 34d for projecting measurement light onto the inclined reflection surface as provided on the Y mirror, and a stationary mirror 37 for reflecting measurement light of the interferometer 34d, having been reflected by the inclined surface 32b, backwardly toward it. While the interferometer 34d projects the measurement light to the reflection surface 32b in the Y direction, the interferometer 34d and the mirrors 32b and 37 have essentially the same functions as those of the interferometer 33d and the mirrors 31b and 35. Also, the interferometer 33e and the mirror 38 have essentially the same functions as those of the interferometer 33d and the mirror 35.

In the stage system shown in FIG. 5, since displacement of the stage in the Z direction can be measured at three locations, not only the Z shift of the stage but also rotational information of the stage in the tilt direction (wx, wY) can be detected.

Figure 6:
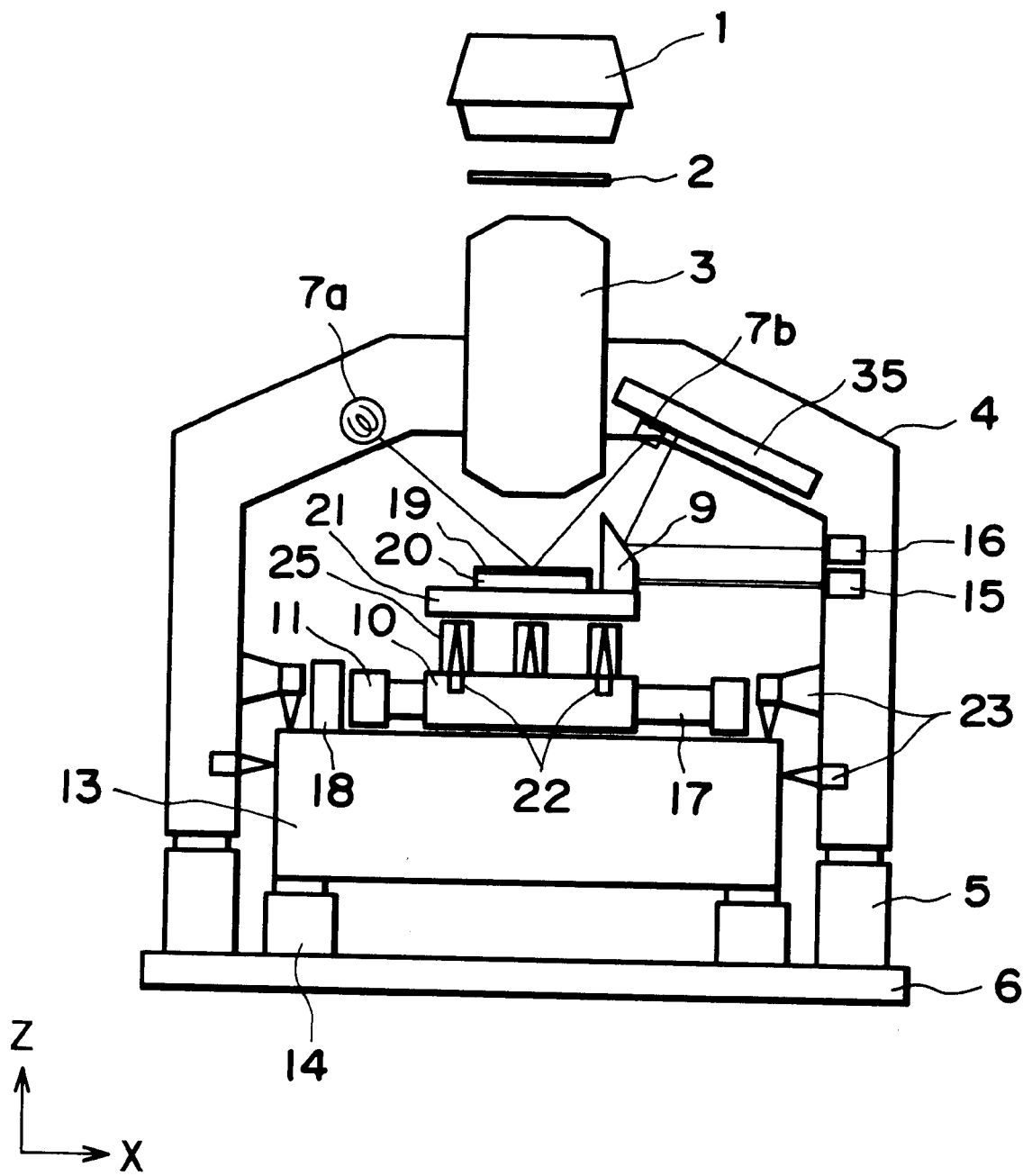
FIG. 6 is a schematic view of a general structure of an exposure apparatus according to an embodiment of the present invention.

FIG. 6 is a schematic and front view of a semiconductor exposure apparatus according to an embodiment of the present invention.

Denoted in the drawing at 1 is an illumination system for illuminating a reticle (original) 2 having a pattern to be transferred. Denoted at 3 is a projection lens (projection optical system) for projecting the pattern, formed on the reticle, onto a wafer (substrate). Denoted at 4 is a barrel supporting member for supporting the projection lens. Denoted at 5 is frame active mount means which functions to support the barrel support member to suppress vibration thereof and also to insulate the same with respect to vibration from the floor. Denoted at 6 is a positioning base table which functions to determine the relative positional relation between the frame active mount means 5 and stage active mount means 14, for setting them.

Denoted at 7a is a light projecting portion of focus detecting means for measuring a distance and any tilt between the the focal point position of the projection lens 3 and the top surface of the wafer Denoted at 7b is a light receiving portion of the focus detecting means. Denoted at 35 is a stationary mirror for Z measurement, being fixedly held by the barrel supporting member 4. Denoted at 9 is a movable mirror having two reflection surfaces extending perpendicularly and obliquely. Denoted at 10 is an X stage being movable in the X direction, and denoted at 11 is a Y stage being movable in the Y direction. Denoted at 13 is a stage base table for supporting the X stage 10 and Y stage 1. Denoted at 14 is stage active mount means which functions to suppress vibration of the stage base table 13 resulting from movement of the stage, and also to insulate the same with respect to vibration from the floor.

Denoted at 15 is laser interferometer measuring means for measuring the relative position of the barrel supporting member 4 and the substrate stage, and also for measuring the posture of the substrate stage. Denoted at 16 is laser interferometer measuring means for measuring the distance between the stationary mirror 8 and the movable mirror 9 on the substrate stage 9 and the barrel supporting member 4, to calculate the position of the substrate stage in the Z direction. Denoted at 17 is a driving X linear motor with an X guide, for moving the X stage in the X direction. Denoted at 18 is a driving Y linear motor with a Y guide, for moving the Y stage in the Y direction.

Denoted at 19 is a semiconductor substrate (wafer) having a photosensitive material applied thereto, to which the pattern is to be projected. Denoted at 20 is a wafer chuck for holding the substrate 19, and denoted at 21 is a top stage (θ-Z stage) for positioning the wafer chuck 20 with respect to the Z, θ, wX and wY directions.

Denoted at 23 are displacement sensors for measuring the positional relation between the barrel supporting member 4 and the stage base table 13. The sensor 23 may comprise an absolute type such as an eddy current type displacement sensor or an electrostatic capacity type displacement sensor, for example.

Upon a start of the operation of this semiconductor exposure apparatus, first, the frame active mount means 5 moves to a predetermined position, by which the barrel supporting member 4 is insulated with respect to vibration from the floor.

Subsequently, the stage active mount means 14 moves to a predetermined position, by which the stage base table 13 is insulated against vibration from the floor. Thereafter, the laser interferometer measuring means is initialized, and origin setting operations for respective laser interferometers are performed. Thus, output values of these laser interferometers represent the positions taking the projection lens or barrel supporting member as a reference. The position measurement to the X-Y stage and top stage (θ-Z stage) following the origin setting operation of the laser interferometers, can be done in the manner as described hereinbefore.

By using the displacement sensors 23, the position of the stage base table is measured while taking the barrel supporting member 4 as a reference, and the stage active mount means 14 is controlled. As regards the position measurement to the stage base table 13 using the displacement sensors, preferably it may be made with respect to six-axis directions. However, the measurement is not limited to it. As regards the resolving power of the displacement sensor 23, at the minimum, the sensor may have a resolution by which the motion of the stage base table in the Z direction and tilt direction is covered by the driving range of the Z actuator 25.

Z displacement sensors 22 may preferably be provided separately to measure the positional relation between the X stags 10 and the top stage 21, since it enables initial position measurement to the top stage. On that occasion, the Z displacement sensor may desirably comprise an absolute type sensor for which origin setting is unnecessary.

As regards control of the stage active mount means 14, feedback control may be made in accordance with the measured values of the displacement sensors 23, as described above. In addition to this, on the basis of driving signals for the X stage, Y stage and top stage (θ-Z stage). reaction forces to be applied to the stage base table 13 as these stages are moved may be calculated beforehand, and feed-forward control may be done to the stage active mount means 14 so that these reaction forces do not cause a shift or vibration of the stage base table 13.

The reticle 2 is placed on a reticle stage, not shown. The reticle stage is mounted on a reticle stage base, not shown, being supported by the barrel supporting member 4, and it is movable while carrying the reticle thereon. The illumination system 1 produces exposure light with which the wafer 19 on the stage 21 can be exposed to the reticle 2 placed on the unshown reticle stage.

The wafer 19 is scanned in synchronism with the reticle 2. During scanning movement of the reticle stage (not shown) and the wafer stage (10, 11, 21) carrying the wafer 19 thereon, the positions of these stages are measured continuously by means of respective interferometers, and the measured positions are fed back to the driving means for the reticle stage and the wafer stage, respectively. With this arrangement, the scan start positions of these stages can be synchronized with each other correctly and, additionally, the scan speed in the constant-speed scan region can be controlled very precisely. During scan of the stages relative to the projection lens, the reticle pattern is projected onto the wafer, whereby the circuit pattern is transferred and printed on the latter.

In accordance with this embodiment, a laser beam parallel to the X-Y plane is projected on a reflection surface being inclined by an angle of 45 deg. or more (θ in FIG. 3 is not less than 45 deg.) with respect to the X-Y plane, which is the reference plane of the stage base table, on the basis of which, position measurement to the stage with respect to the Z direction is performed. Thus, with a very simple structure, direct measurement can be performed while taking the barrel supporting member, supporting the interferometers, as a reference. Therefore, even if the stage base table which supports the stage is deformed with the movement of the stage, an error in the Z-direction position measurement can be reduced significantly.

Further, since the laser beans projected onto the mirrors for stage position measurement all comprise laser light parallel to the X-Y plane, the position measuring system based on the laser interferometers can be made very simple.

Further, since the stage position measurement with respect to the six-axis directions uses the same measuring devices (laser interferometers), their frequency characteristics are substantially the same and, also in this respect, the measurement error can be reduced significantly.

When a positioning device with such a position measuring system is incorporated into a semiconductor exposure apparatus, it enables high precision measurement of wafer position or posture. Thus, a high precision exposure process can be accomplished. Additionally, because of a simplified stage measuring system, reduction in size or weight and reduction in cost of the exposure apparatus are attainable.

It is to be noted here that it is not always necessary for the inclined reflection surface to be inclined by 45 deg. or more with respect to the X-Y plane. The angle may be less than 45 deg. However, it the mirror reflects the light at an acute angle with respect to incident light, projected thereto, the stationary mirror 35 can be made small. Also, since it is effective to narrow the region for the laser light, air conditioning for the laser light path is facilitated. The acute angle referred to here means an angle greater than zero deg. and not greater than 90 deg. (including 90 deg.).

The stage may be provided with a plurality of inclined reflection surfaces. On that occasion, if measurement is done at three or more locations while using inclined reflection surfaces, not only displacement of the stage in the Z direction (taking the barrel supporting member as a reference) but also rotational information about the stage with respect to tilt directions (wX and wY) can be detected. Further, measurement may be made while interchangeably using plural inclined reflection surfaces, in accordance with the state of operation of the stage. This enables stage measurement, avoiding any blocking element (e.g., barrel) within the exposure apparatus which might interfere with the obliquely reflected laser beam.

The measuring system of this embodiment is not limited to use with the wafer stage as described. It may be applied to a reticle stage, for example. Further, the measuring system having inclined reflection surfaces of this embodiment may be applied to a positioning system for accurately positioning a movable element. Substantially the same advantageous results will be attainable on those occasions.

In this embodiment, the position or posture of the stage base table is measured while taking the barrel support member as a reference. Vibration of the stage base table relative to the projection lens can, therefore, be reduced significantly.

Further, since the positions or postures of the wafer stage and of the stage base table for supporting the wafer stage are measured while taking the barrel support member as a reference, load to the wafer stage control can be reduced significantly. Particularly, if the control of position and posture of the stage base table is held within the driving range of a fine-motion mechanism (driving mechanism for Z tilt, θ direction) inside the wafer stage system, the wafer stage can be controlled very stably.

Next, an embodiment of a semiconductor device manufacturing method which uses an exposure apparatus such as described above, will be explained.

Figure 7:
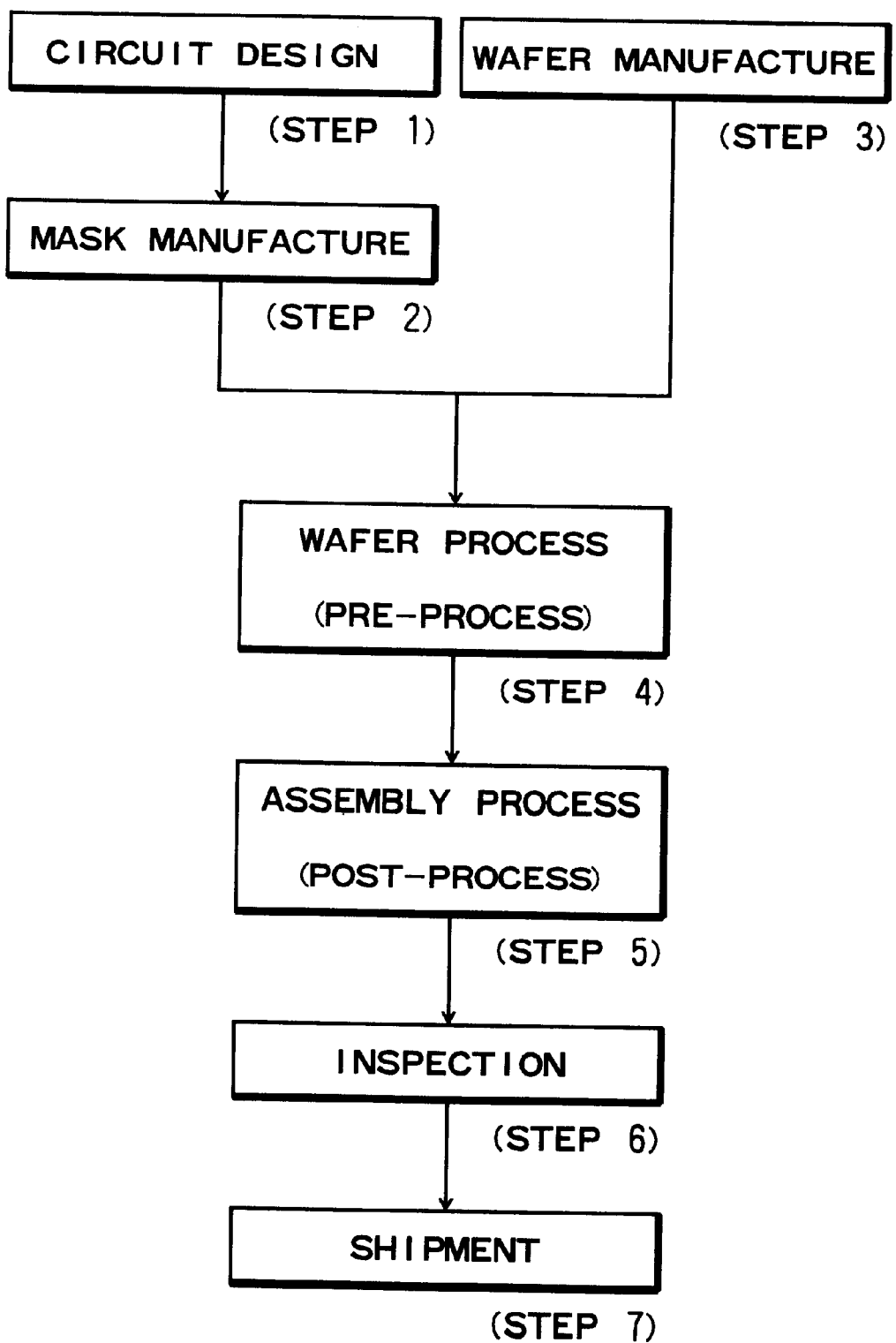
FIG. 7 is a flow chart of a semiconductor device manufacturing procedure, according to an embodiment of the present invention.

FIG. 7 is a flow chart of a procedure for the manufacture of microdevices such as semiconductor chips (e.g., ICs or LSIs), liquid crystal panels or CCDs. for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the water through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 8:
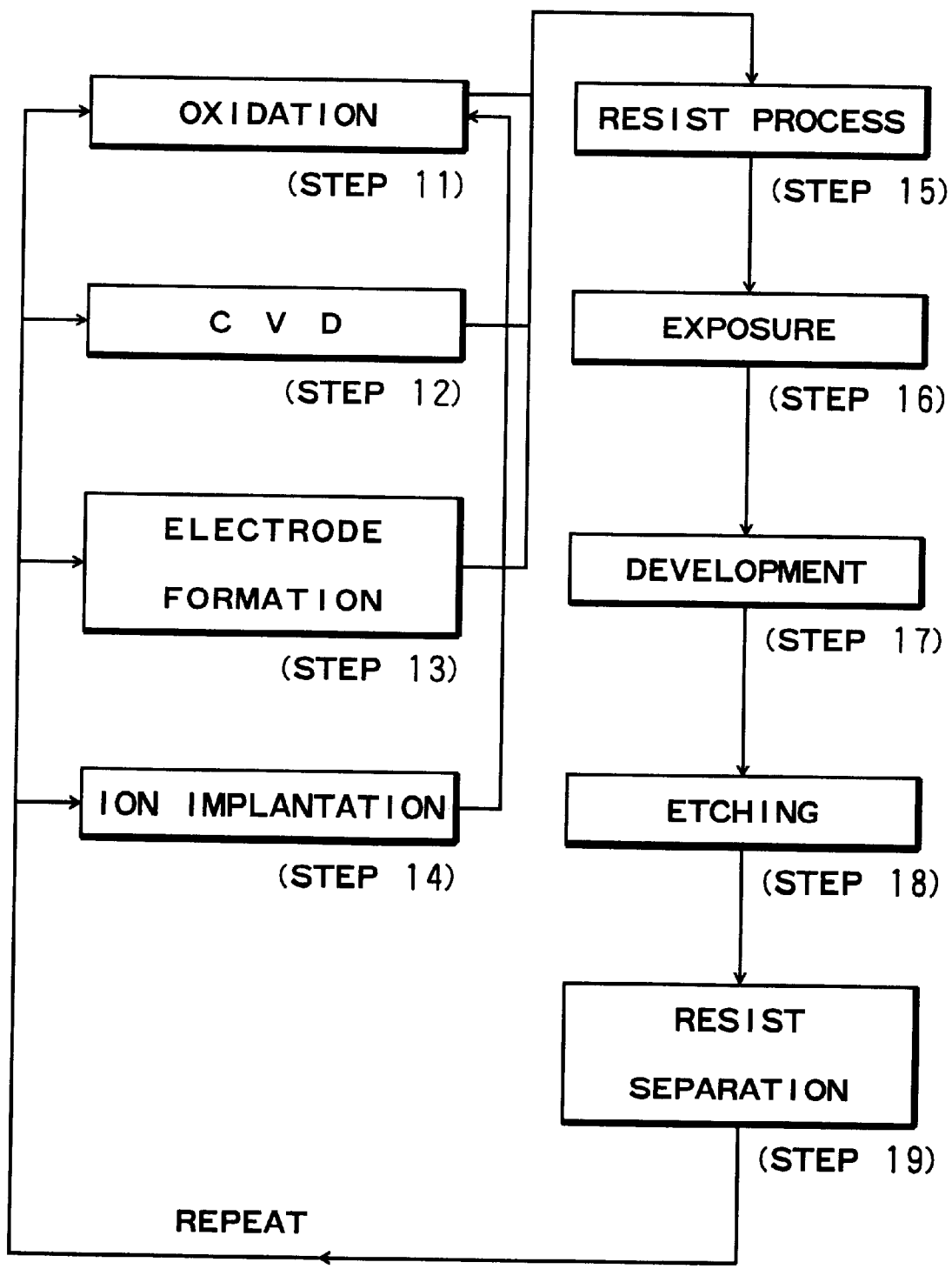
FIG. 8 is a flow chart for explaining a wafer process, in the present invention.
Figure 9:
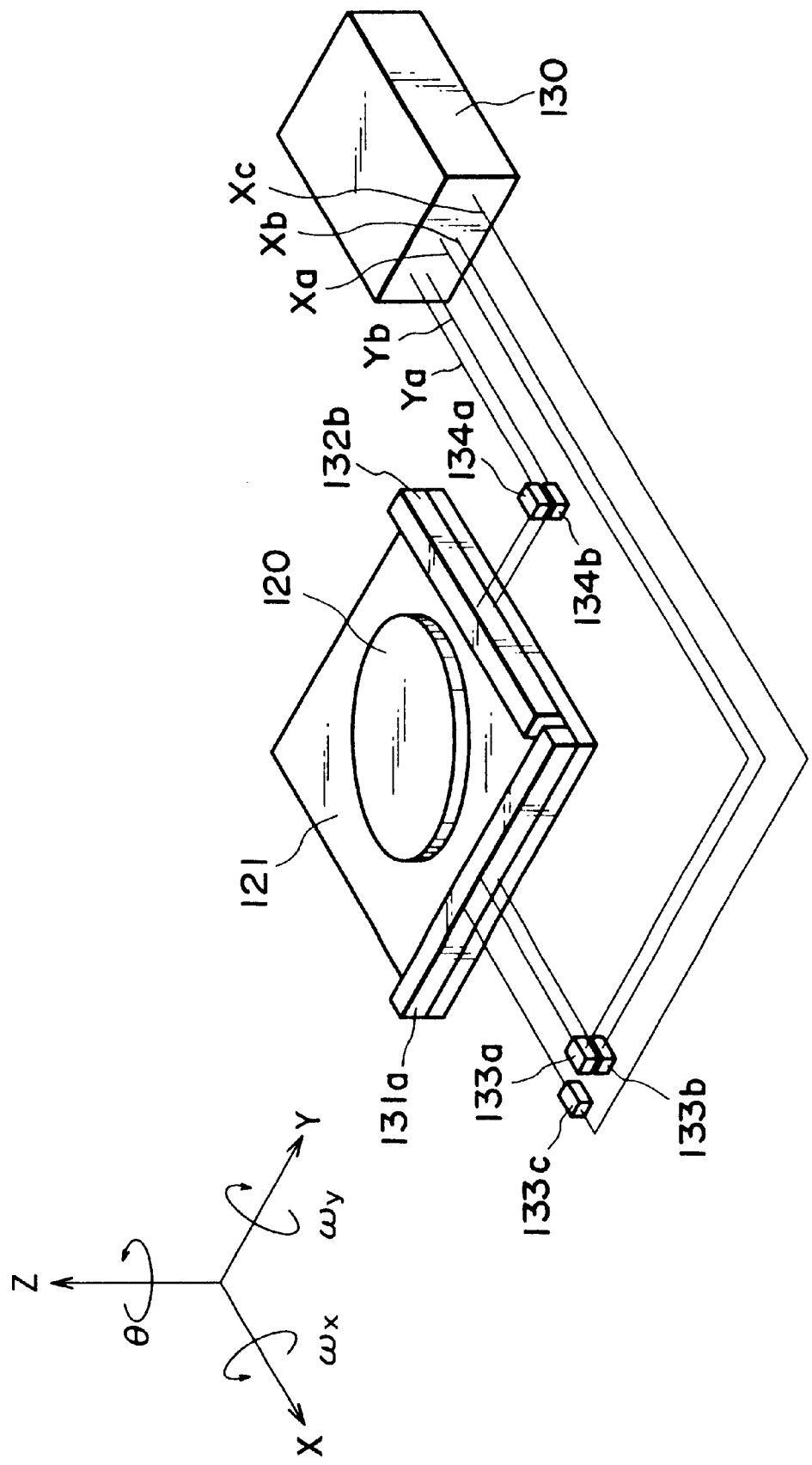
FIG. 9 is a schematic view for explaining a known type of a stage measuring system.
Figure 10:
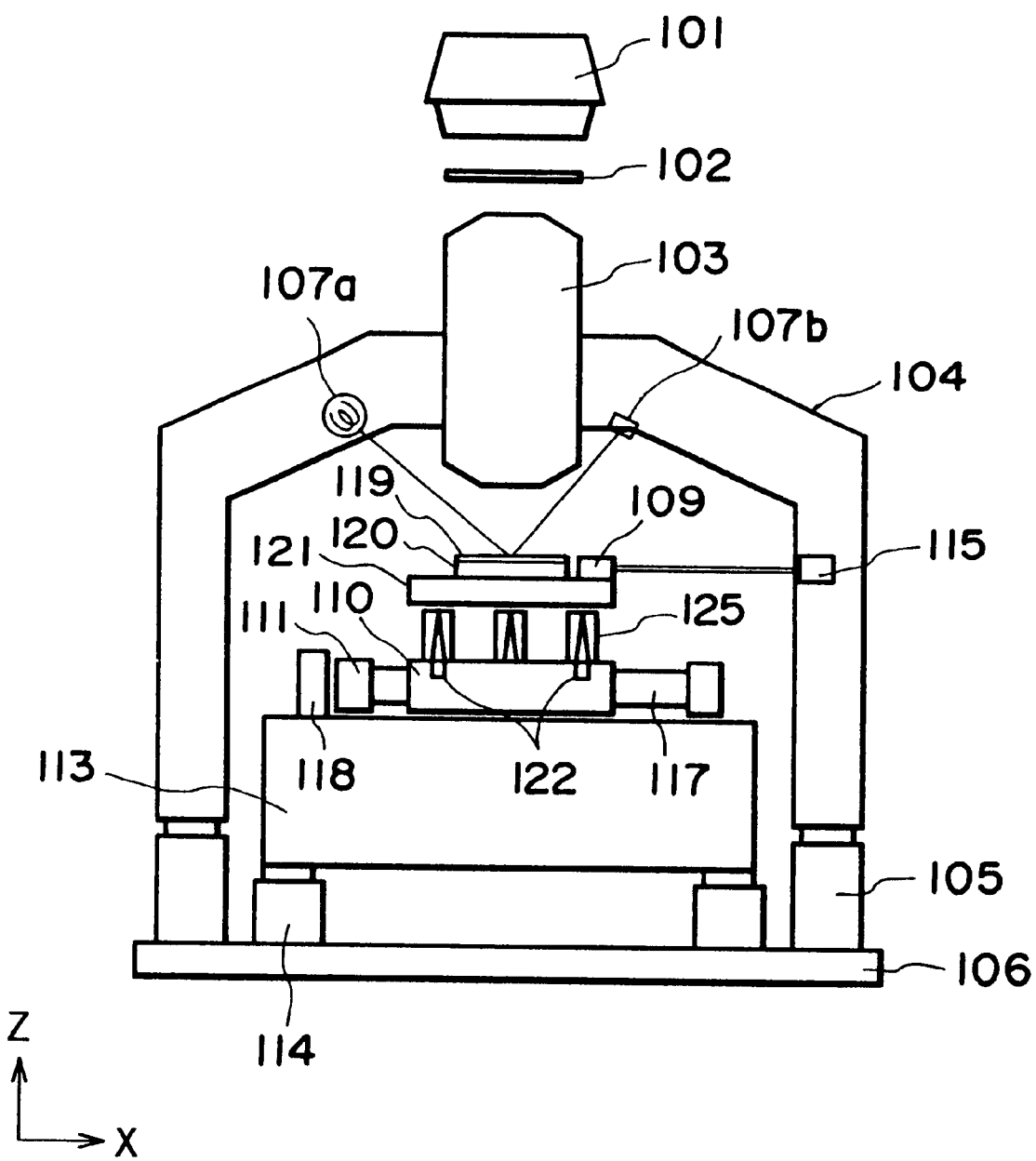
FIG. 10 is a schematic view of a general structure of a known type of an exposure apparatus.

FIG. 8 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In an exposure apparatus according to the present invention, positions of a stage and a stage base can be measured separately. Therefore, even for any deformation of the stage base table, a measurement error in the measurement of the position of the stage with respect to a barrel support can be reduced significantly.

Further, in an exposure apparatus according to the present invention, a measurement beam is reflected obliquely. This enables that, with a simple structure, positional information related to the stage with respect to a direction other than the direction of incidence of the measurement beam, is detected.

In an exposure apparatus according to the present invention, an inputted beam is reflected at an acute angle. This enables narrowing the region for the inputted beam and the reflected beam.

In an exposure apparatus according to the present invention, measurement can be done by use of a beam being reflected obliquely and while taking a barrel support as a reference.

In an exposure apparatus according to the present invention, measurement of position and/or rotation of a stage with respect to the Z direction and tilt direction can be made while taking a barrel support as a reference.

In an exposure apparatus according to the present invention, the positions of a stage and a stage base table can be measured while taking a barrel support as a reference, which barrel support is made independent from the stage or stage base with respect to vibration. This effectively ensures correct measurement of the positional relation between the stage and a projection optical system.

In an exposure exposure apparatus according to the present invention, the position of a stage base with respect to a barrel support can be controlled separately from the stage. This enables reduction of the driving range of the stage supported by the stage base, or it ensures stable stage control such that the stage movement is exactly covered by the driving range.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a projection optical system;
   a barrel supporting member for supporting said projection optical system;
   a stage being movable relative to said projection optical system;
   a base for supporting said stage, wherein said base is isolated from said barrel supporting member with respect to vibration;
   base measuring means for measuring at least one of a position and a displacement of said base with respect to said barrel supporting member; and
   stage measuring means for measuring at least one of a position and a displacement of said stage with respect to said barrel supporting member.

2. An apparatus according to claim 1, wherein said stage measuring means includes a laser interferometer.

3. An apparatus according to claim 2, wherein said interferometer projects measurement light to a reflection surface associated therewith, along a direction orthogonal to an optical axis of said projection optical system.

4. An apparatus according to claim 2, wherein said stage is provided with a reflection surface for obliquely reflecting measurement light projected from said interferometer.

5. An apparatus according to claim 2, wherein said stage is provided with a first reflection surface extending substantially perpendicularly to measurement light projected from said interferometer, and a second reflection surface for obliquely reflecting measurement light projected from said interferometer.

6. An apparatus according to claim 4, wherein the measurement light being obliquely reflected bears a component in the optical axis direction of said projection optical system.

7. An apparatus according to claim 4, wherein a plane, which contains the measurement light projected from said interferometer and the measurement light as obliquely reflected, is substantially parallel to an optical axis of said projection optical system.

8. An apparatus according to claim 4, wherein an acute angle is defined between the measurement light as projected and the measurement light as obliquely reflected.

9. An apparatus according to claim 4, further comprising stationary reflection means having a reflection surface for reflecting the obliquely reflected measurement light.

10. An apparatus according to claim 9, wherein said stationary reflection means is provided on said barrel supporting member.

11. An apparatus according to claim 9, wherein a normal to said stationary reflection means extends substantially parallel to a direction of the measurement light projected on said stationary reflection means.

12. An apparatus according to claim 4, wherein said stage has plural reflection surfaces, each being said reflection surface, for reflecting measurement light obliquely.

13. An apparatus according to claim 12, wherein said stage measuring means selectively uses said reflection surfaces of said stage.

14. An apparatus according to claim 13, wherein said stage measuring means selectively uses said reflection surfaces of said stage in accordance with positional information related to said stage.

15. An apparatus according to claim 12, wherein said stage measuring means projects measurement light to at least one of said reflection surfaces, at least at three locations.

16. An apparatus according to claim 15, wherein said stage measuring means measures at least one of a position and a displacement of said stage with respect to an optical axis direction of said projection optical system, and a rotational component of said stage in a direction inclined with respect to the optical axis of said projection optical system, by use of plural measurement lights as obliquely reflected.

17. An apparatus according to claim 4, wherein said stage measuring means measures at least one of a position and a displacement of said stage with respect to an optical axis direction of said projection optical system, by use of the measurement light as obliquely reflected.

18. An apparatus according to claim 1, wherein said stage measuring means performs position or displacement measurement with respect to six-axis directions of said stage.

19. An apparatus according to claim 1, further comprising control means for controlling said stage on the basis of the measurement by said stage measuring means.

20. An apparatus according to claim 1, further comprising mount means through which said barrel supporting member is supported on a floor.

21. An apparatus according to claim 20, wherein said mount means comprises an active mount.

22. An apparatus according to claim 1, further comprising mount means through which said base is supported on a floor.

23. An apparatus according to claim 22, wherein said mount means comprises an active mount.

24. An apparatus according to claim 1, further comprising first mount means for supporting said barrel supporting member and second mount means, separate from said first mount means, for supporting said base.

25. An apparatus according to claim 22, wherein said base supporting mount means is controlled in accordance with the detection by said base measuring means.

26. An apparatus according to claim 22, wherein said base supporting mount means is controlled in accordance with a stage driving signal.

27. An apparatus according to claim 1, wherein said exposure apparatus is used with a reticle and a wafer, for performing an exposure process in which the reticle and the wafer are scanningly moved relative to said projection optical system while exposure light is projected to the reticle during the scan, such that a pattern of the reticle is transferred to the wafer.

28. A device manufacturing method, comprising the steps of:

registering a barrel support for supporting a projection optical system, with respect to a predetermined position;

moving a stage relative to the projection optical system;

supporting the stage by a base;

isolating the base from the barrel support with respect to vibration;

measuring at least one of a position and a displacement of the base with respect to the barrel supporting member;

measuring at least one of a position and a displacement of the stage with respect to the barrel supporting member; and transferring a reticle pattern to a wafer placed on the stage to manufacture a device.

29. A method according to claim 28, further comprising registering the base for supporting the stage, being movable relative to the projection optical system, with respect to a predetermined position.

30. A method according to claim 28, further comprising applying a photosensitive material to the water, and developing an exposed portion of the wafer.

31. An exposure apparatus, comprising:

a projection optical system;

a barrel supporting member for supporting said projection optical system;

a stable movable relative to said projection optical system;

a base for supporting said stage;

a first mount for supporting said barrel supporting member;

a second mount for supporting said base; and a base measuring system for measuring at least one of a position and a displacement of said base with respect to said barrel supporting member.

32. An apparatus according to claim 31, further comprising a stage measuring system for measuring at least one of a position and a displacement of said stage with respect to said barrel supporting member.

33. An apparatus according to claim 32, wherein said stage measuring system includes a laser interferometer.

* * * * *

UNITED STATES PATENT AND TRADEMARK OFFICE
CERTIFICATE OF CORRECTION

PATENT NO. : 6,285,457 B1
DATED : September 4, 2001
INVENTOR(S) : Takao Ukaji

It is certified that error appears in the above-identified patent and that said Letters Patent is hereby corrected as shown below:

Column 1,
Line 44, "bean" should read -- beam --.
Line 51, "113b" should read -- 133b --.

Column 3,
Line 17, "he" should read -- be --.

Column 4,
Line 10, "he" should read -- be --.

Column 6,
Line 64, "$\Delta d_2 = (\Delta x + \Delta z \tan\theta) \cos 2\theta$" should read -- $\Delta d_2 = (\Delta x + \Delta z \tan\theta) \cos 2\theta$ --.

Column 8,
Line 18, "31b." should read -- 31b, --.
Line 55, "wafer Denoted" should read -- wafer. Denoted --.

Column 9,
Line 56, "stags" should read -- stage --.

Column 10,
Line 37, "beans" should read -- beams --.

Column 12,
Line 35, "exposure" (second occurrence) should be deleted.

UNITED STATES PATENT AND TRADEMARK OFFICE
CERTIFICATE OF CORRECTION

PATENT NO. : 6,285,457 B1
DATED : September 4, 2001
INVENTOR(S) : Takao Ukaji

It is certified that error appears in the above-identified patent and that said Letters Patent is hereby corrected as shown below:

<u>Column 14,</u>
Line 43, "water," should read -- wafer, --.
Line 50, "stable" should read -- stage --.

Signed and Sealed this

Twenty-sixth Day of March, 2002

*Attest:*

JAMES E. ROGAN
*Attesting Officer*     *Director of the United States Patent and Trademark Office*